United States Patent [19]

Meyer et al.

[11] Patent Number: 5,125,259
[45] Date of Patent: Jun. 30, 1992

[54] HAND TOOLING FOR FORMING ELECTRICAL CONTACT ELEMENTS

[75] Inventors: David L. Meyer, Jonestown; Todd M. Spangler, Lancaster, both of Pa.

[73] Assignee: AMP Incorporated, Harrisburg, Pa.

[21] Appl. No.: 697,361

[22] Filed: May 8, 1991

[51] Int. Cl.$^5$ .................. B21D 7/06; H01R 43/00
[52] U.S. Cl. ......................... 72/409; 72/385; 72/381; 72/323; 72/404; 29/874; 29/758; 140/105
[58] Field of Search ............... 72/409, 404, 384, 385, 72/386, 442, 322, 323, 381; 140/105, 106; 29/874, 747, 758

[56] References Cited

U.S. PATENT DOCUMENTS

| | | | |
|---|---|---|---|
| 1,645,865 | 10/1927 | Kondakjian | 72/385 |
| 2,217,486 | 10/1940 | Larson | 72/404 |
| 2,892,368 | 6/1959 | Demler | 72/404 |
| 3,432,906 | 3/1969 | McNamara | 29/747 |
| 3,601,890 | 8/1971 | Pityo | 29/874 |
| 4,070,754 | 1/1978 | Bauerkemper | 29/758 |
| 4,386,461 | 6/1983 | Plummer | 29/758 |
| 4,553,420 | 11/1985 | Fierkens | 140/105 |

OTHER PUBLICATIONS

Hastede, R. G., et al., "Core Plane Terminal Forming Die" from IBM Technical Disclosure Bulletin, vol. 8, No. 9, Feb., 1966, pp. 1208, 1209.

*Primary Examiner*—Daniel C. Crane
*Attorney, Agent, or Firm*—David L. Smith

[57] ABSTRACT

There is disclosed, a kit of parts for a hand tool (2) for forming electrical tabs (T1,T2) projecting from cable end portions (FC1, FC2) to a plurality of different configurations. The kit of parts comprises a plurality of different tab forming dies (14,16,18), a base assembly (8) having thereon two spaced tab forming anvils (10,12) for co-operation respective ones of the dies (14,16,18), an upper tooling mount assembly (6) having a spline (60) for receiving a selected one of the dies (14,16,18), and an actuating mechanism (4). The tooling mount assembly (6) is mounted to the base assembly (8) so as to be moveable theretowards through a working stroke to cause the selected die (14,16,18), on the spline (60) to co-operate with the appropriate anvil (10,12) to form the tabs (T1 or T2) of a cable end portion (FC1,FC2) laid on a cable receiving surface (92,104) of the appropriate anvil (10,12) to a particular configuration determined by the choice of the die (14,16,18) and anvil (10,12). The actuating mechanism (4) has a moveable handle (32) which can be depressed to drive the tooling mount assembly (6) through its working stroke.

18 Claims, 16 Drawing Sheets

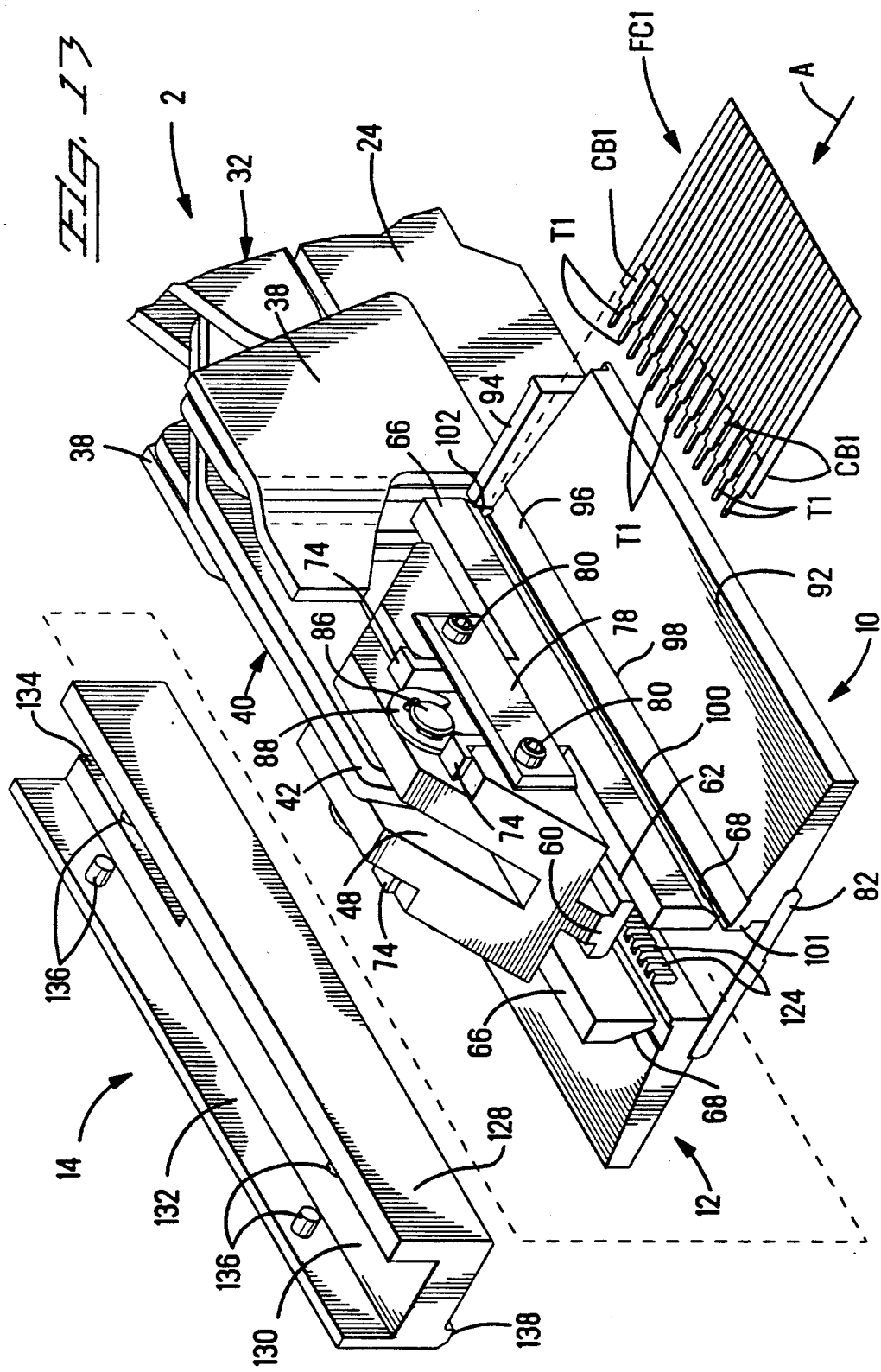

HAND TOOLING FOR FORMING ELECTRICAL CONTACT ELEMENTS

BACKGROUND OF THE INVENTION

This invention relates to hand tooling for forming electrical contact elements, and in particular to a kit of parts for a hand tool for forming electrical contact elements, in particular electrical tabs, projecting from cable end portions, to a plurality of different configurations, especially in the case of electrical tabs projecting rectilinearly from end portions of flat flexible ribbon cables. A usual requirement for forming such contact elements to different configurations, arises where the contact elements are to be inserted into holes in printed circuit boards with the cable either extending parallel to a circuit board or perpendicularly with respect thereto according to customer requirements and the holes in the boards being arranged in one or more rows according to customer requirements.

There has already been proposed, for forming electrical tabs projecting from the ends of flat flexible cables, for the purpose outlined above, a bench press comprising a press ram and a press platen on which is a tab forming anvil for cooperation with a die on the press ram. The anvil is moveable on the platen between a first position beneath the press ram, for forming the tabs to a first configuration and to a second position beneath the press ram, for forming the tabs to a second configuration. Further configurations of the tabs can be achieved, by appropriately positioning the cable end portion on the anvil. Although versatile, such a bench tool is unsuitable for use in the field, where electrical or electronic repair work involving the connection of cables to circuit boards, needs to be done. Also, for use as production tooling such a bench press is somewhat bulky and is relatively expensive.

SUMMARY OF THE INVENTION

The invention is intended to provide a hand tool for forming electrical contact elements, in particular electrical tabs projecting from cable ends, to a plurality of different configurations, which tool is made up from a kit of parts which are relatively easy to assemble, contact element forming dies and anvils of the tool being exchangeably mountable thereto in order to provide for said different configurations. Briefly state, a kit of parts, according to the invention, comprises a set of forming dies, a base assembly having thereon a pair of anvils each for cooperation with a particular die, an upper tooling mount assembly for exchangeably receiving a selected on of said dies and which is moveable through a working and return stroke so that the selected die forms contact elements of a cable end portion on the anvil, to the required configuration or configurations and is returned and a hand operated actuating mechanism connected to the said assemblies, for driving the tooling mount assembly through its working and its return strokes.

A forming insert may be provided for insertion into the base assembly, between the anvils thereof, for cooperation with a corresponding one of said dies to form the contact elements of a cable end portion to a particular desired configuration, for example, to a Z-shaped configuration.

Conveniently, the upper tooling mount assembly comprises a body defining an upward opening channel in which a moveable actuating member of the actuating mechanism pivotally mounted, and a stabilizing bar projecting below the body for insertion through a hole in a baseplate supporting the anvils, the actuating mechanism having a fixed projection engaging the underside of the baseplate. The said body is thereby very simply arranged to be driven through its working and its return strokes by means of the actuating mechanism. The body may have on either side thereof a spring loaded pressure plate for holding down the cable end portions on the anvils.

For ready, exchangeable mounting of said dies to the body, the body may be provided with a depending spline, each die defining a channel for slideably receiving the spline and the body being provided with detent means for engaging the base of the channel of the die to restrain withdrawal thereof from the body.

Each of the dies may be formed with a slot in the base of the channel of the die for receiving the stabilizing bar, the bar engaging the end of the slot when the spline has been fully received in the channel of the die.

BRIEF DESCRIPTION OF THE DRAWINGS

FIG. 13 is an enlarged, fragmentary, exploded, isometric view of the tool showing the end portion of said first cable about to be presented to the tool, the die of FIG. 10 being mounted to the tool;

DETAILED DESCRIPTION OF THE INVENTION

Figure 1:
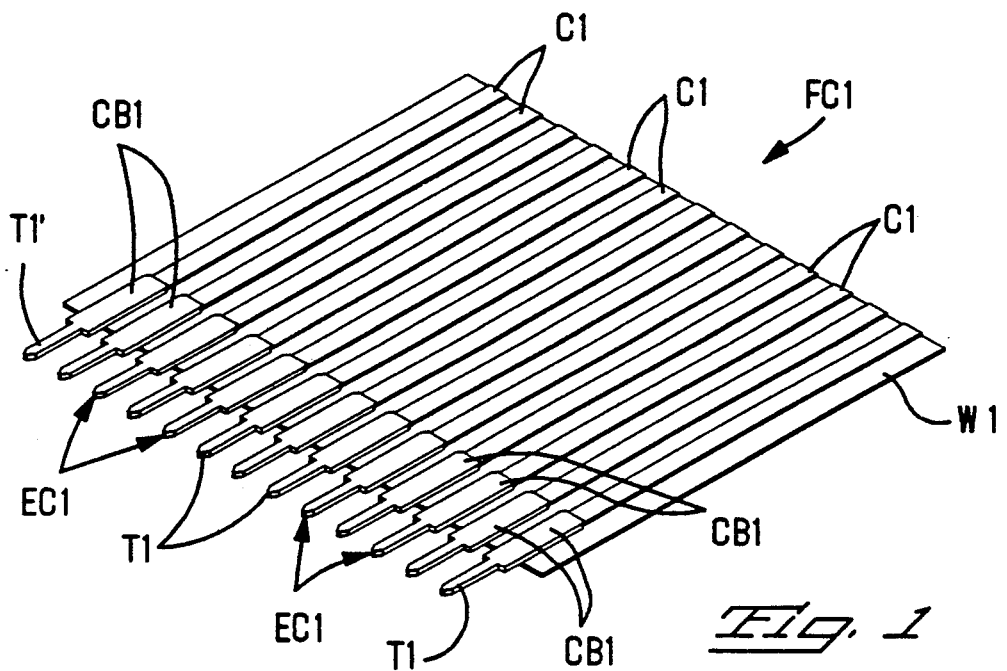
FIG. 1 is an isometric view of an end portion of a first flat flexible cable showing an end thereof with first electrical tabs projecting therefrom.

As shown in FIG. 1, a first flat flexible ribbon cable FC1 comprises an insulating web W1 which are embedded, parallel flat conductors C1, to stripped end portions of which have been crimped, crimping barrels CB1 of first electrical contacts EC1 having solder tabs T1 projecting from an end of the cable FC1, as shown, in coplanar parallel relationship. The centerline to centerline spacing between the conductors C1 is 0.100 of an inch, in the present example.

Figure 2:
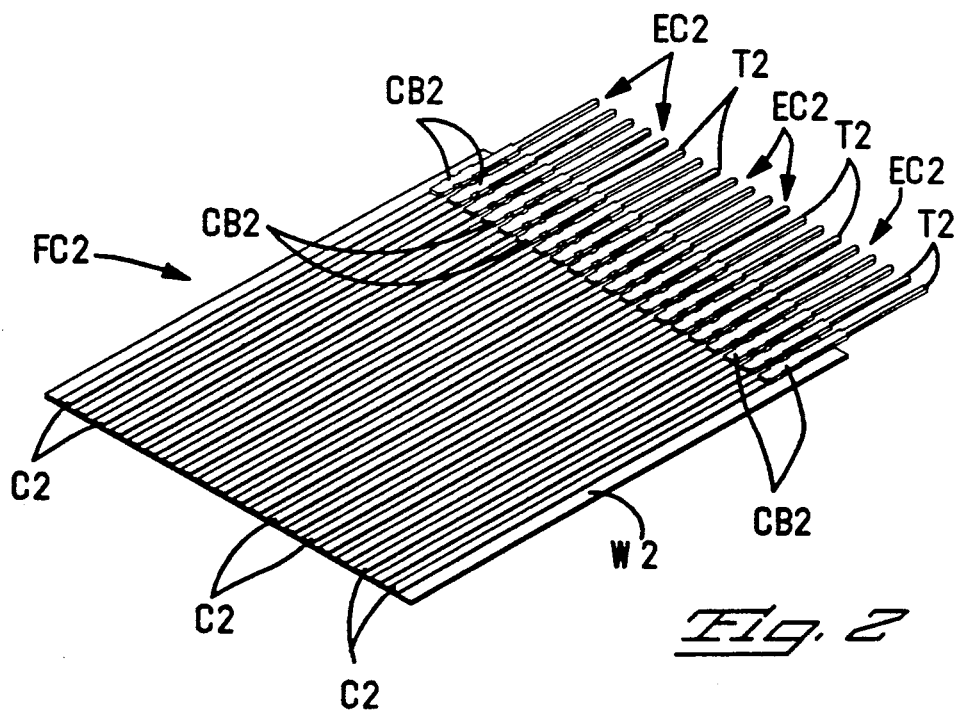
FIG. 2 is an isometric view of an end portion of a second flat flexible cable showing an end thereof with second electrical tabs projecting therefrom.

FIG. 2 shows a second flat flexible ribbon cable FC2 comprising an insulating web W2 in which are embedded parallel flat conductors C2, to stripped end portions of which have been crimped, crimping barrels CB2 of second electrical contacts EC2 from which solder tabs T2 project from an end of the cable FC2 in coplanar parallel relationship, as shown. The centerline to centerline spacing of the conductors C2 is 0.050 of an inch in the present example. The tabs T2 are substantially longer than the tabs T1 of the cable FC1.

Figure 3:
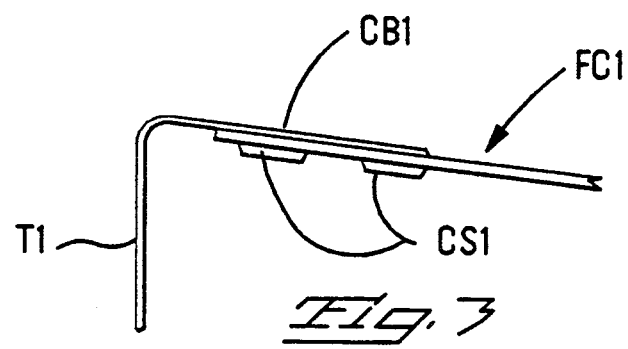
FIG. 3 is a fragmentary side view of the cable end portion of FIG. 1 showing the tabs thereof bent through 90°.
Figure 4:
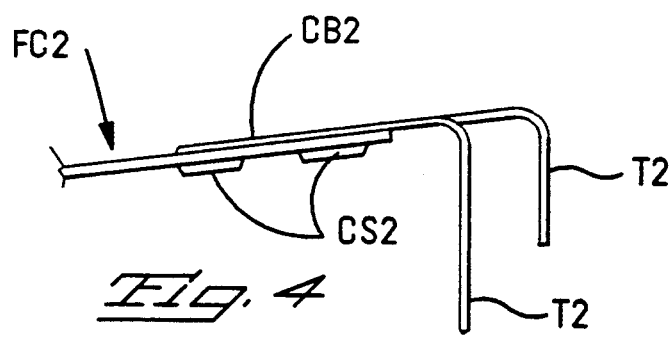
FIG. 4 is a fragmentary side view of the cable end portion of FIG. 2 showing the tabs thereof bent through 90° in staggered relationship.
Figure 5:
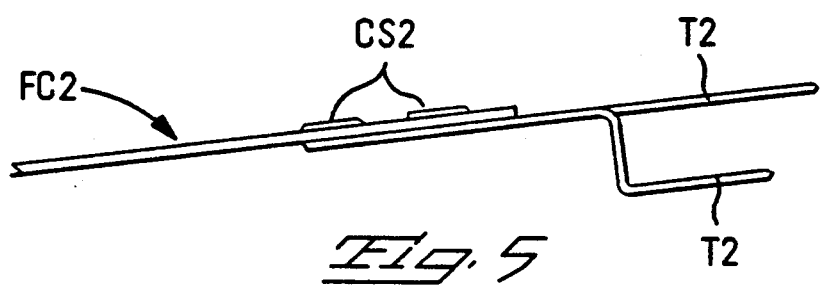
FIG. 5 is a fragmentary side view of the cable end portion of FIG. 2 showing alternate tabs thereof bent to Z-configuration.

There is described in detail below, a hand tool 2 for forming the tabs T1 of the cable FC1 or the cable FC2, to a first configuration, FIG. 3, and the tabs T2 of the cable FC2 either to a second configuration, FIG. 4, or to a third configuration, FIG. 5, for inserting into correspondingly located holes in a printed circuit board (not shown).

According to said first configuration, which is referred to herein as the "straight 90° configuration", all of the tabs T1 are bent down at right angles and at the same position in each case, intermediate their ends, whereby the bent down portions of the tabs T1 all lie in a common plane. According to said second configuration, referred to herein as the "90° staggered configuration" alternate ones of the tabs T2 are bent down at one position intermediate their ends and the remaining tabs T2 are bent down at another position intermediate their ends, so that the bent down portions of the tabs are arranged in two rows which are staggered in the lengthwise direction of the contacts EC2, the ends of the bent over portions of the tabs T2 thereby being arranged in two rows. According to said third configuration which is referred to herein as the "straight Z-configuration", alternate ones of the tabs T2 are bent to Z-shape and each of these alternate tabs are accordingly bent at two spaced positions intermediate ends. The remaining tabs T2 remain undeformed, whereby the end portions of the bent tabs T2 extend parallel to the remaining tabs T2 and are spaced therefrom in a direction at right angles to the plane of the cable FC2, the ends of the bent tabs T2 being staggered back towards the cable FC2 with respect to the ends of the unbent tabs T2.

The construction of the tool 2 which comprises a kit of parts for assembly together to form said tabs to the configurations described above, will now be described with particular reference to FIGS. 6 to 12. The tool basically comprises a manual actuating mechanism 4, an upper tooling mount assembly 6, and a base assembly 8 including a first anvil 10 and a second anvil 12. There are provided for mounting to the assembly 6, a first upper die 14, a second upper die 16, and a third upper die 18, a lower insert 20 being provided for mounting to the base assembly 8.

Figure 7:
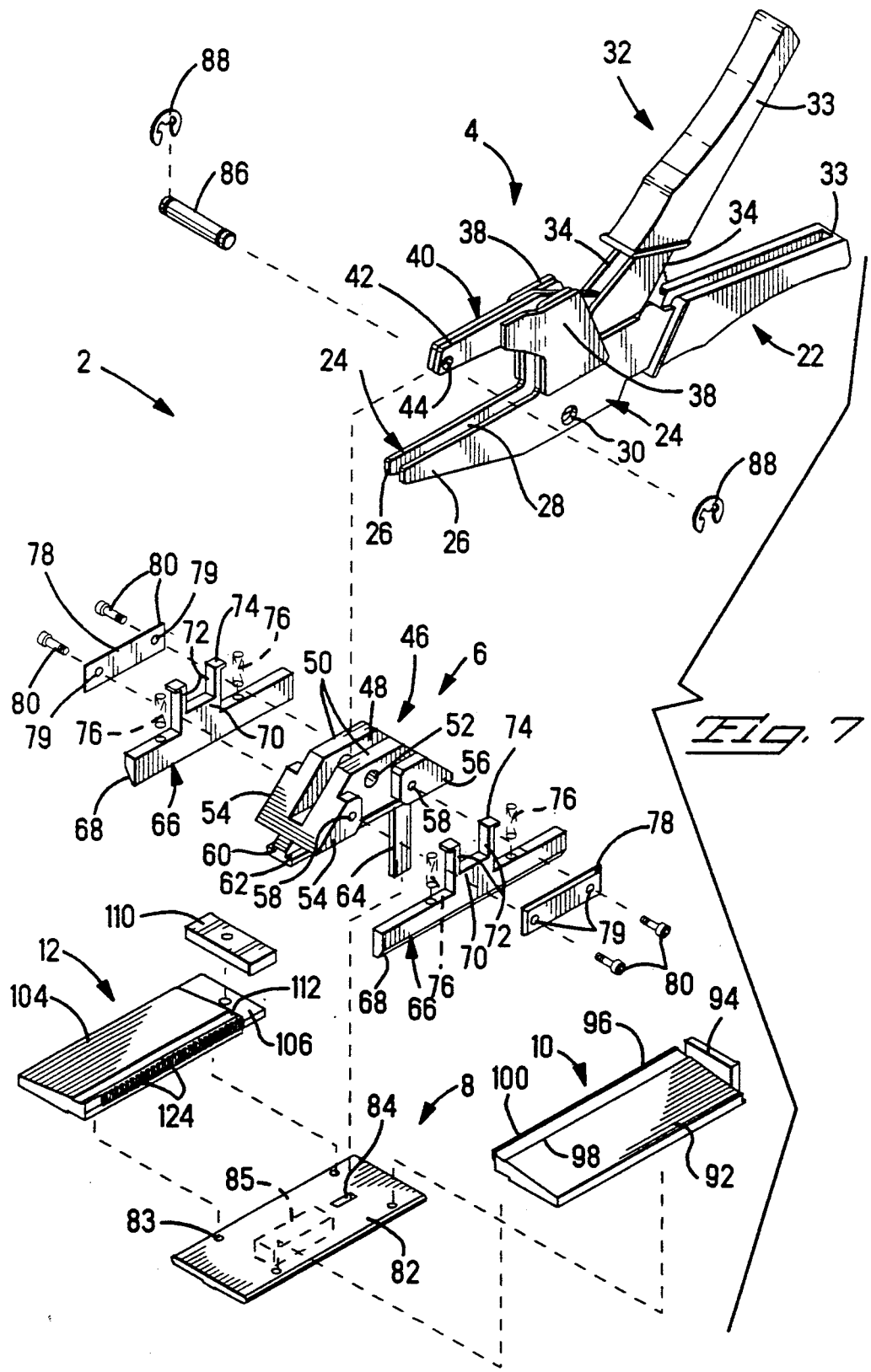
FIG. 7 is a partially diagrammatic exploded isometric view of the tool, with parts omitted.

The manual actuating mechanism 4 comprises as best seen in FIG. 7, a fixed handle 22 having a pair of parallel spaced cheeks 24 from which project forwardly a pair of forwardly tapered prongs 26, defining between them, a channel 28 which opens both upwardly and downwardly. The cheeks 24 have aligned, through holes 30 located just rearwardly of the prongs 26, for receiving a clamping pin of a tool mounting assembly which is not shown, but which is described in outline below. The tool mounting assembly is disclosed in patent application Ser. No. 675,581, filed on Mar. 26, 1991, and which is hereby incorporated herein by reference. There is pivotally mounted between the cheeks 24, rearwardly of the holes 30, a moveable handle 32 comprising a pair of cheeks 34, extending between the cheeks 24. The handle 32 is urged away from the handle 22 by means of a return string (not shown). The handles 22 and 32 have plastic hand grips 33. There upstands from the cheeks 24, a pair of spaced, parallel supports 38 between which is pivoted, at 39 (FIG. 8) a bell crank 40 comprising a pair of juxtaposed, parallel plates, and one end portion of which protrudes between the cheeks 34 of the handle 32 and is pivotally attached thereto. The other end portion 42, that is to say the forward end portion, of the bell crank 40 projects forwardly of the supports 38 and is formed with aligned through holes 44 proximate to its free end. By manually pressing the handle 32 towards the handle 22, the end portion 42 of the bell crank 40 can be depressed towards the prongs 26 under the mechanical advantage afforded by the handle 32 and the bell crank 40.

Figure 8:
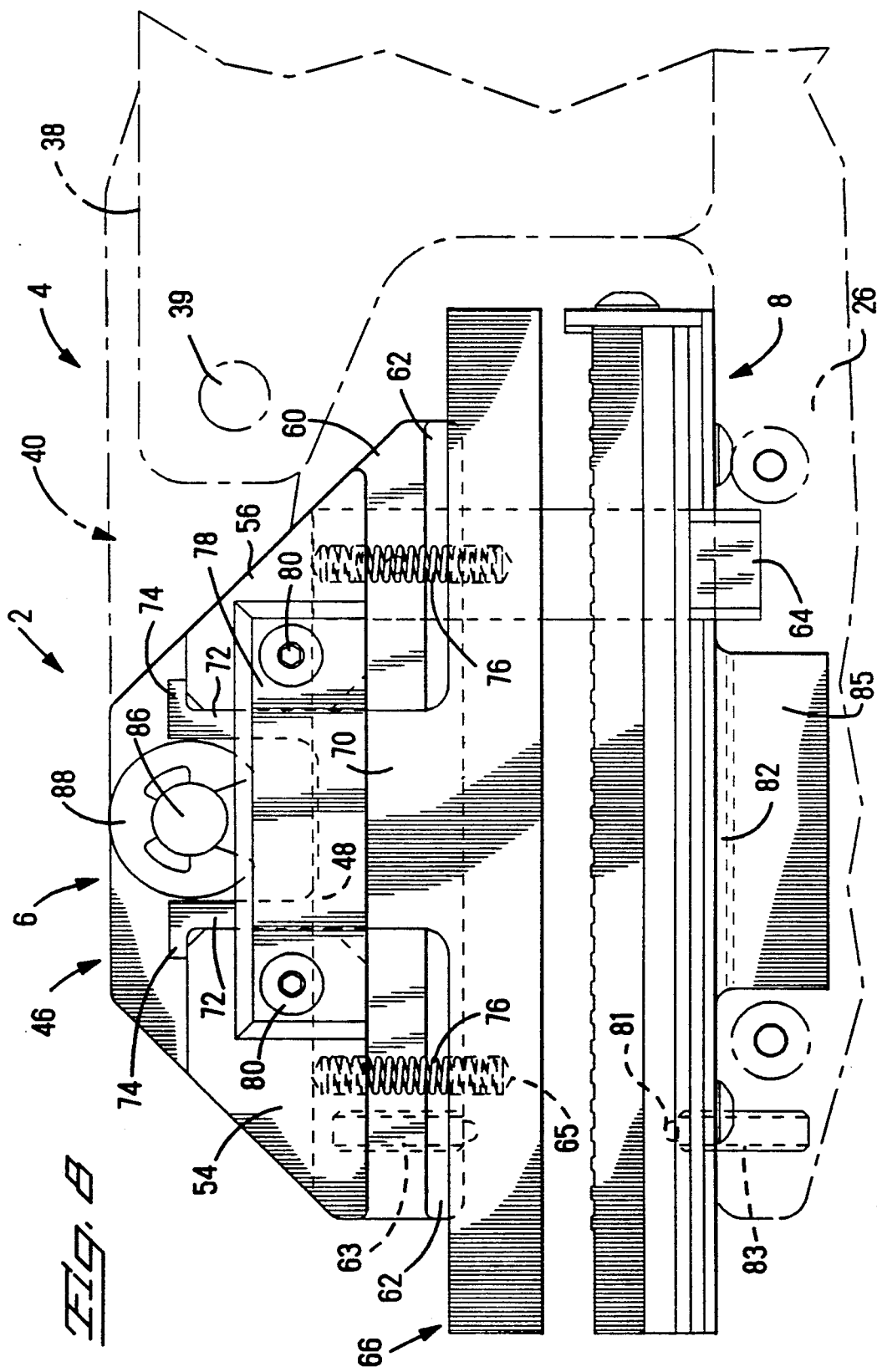
FIG. 8 is an enlarged fragmentary side view of the tool with parts thereof shown in fantom form.

The upper tooling mount assembly 6 comprises a tool mount body 46 in the form of a block having a central upwardly opening channel 48, defined by opposed side walls 50 having aligned holes 52 therethrough as shown in FIG. 7. The forward and rear edges of the walls 50 are chamfered. The exterior of each wall 50 is formed with forward, and rear, pressure plate support blocks 54 and 56 respectively, each having a tapped hole 58. The bottom of the tooling mount body 46 is formed with a T-cross section, central, longitudinally extending, upper die support spline 60 having a cross piece 62 spaced from the bottom of the body 46. A spring loaded ball plunger 63 below the body 46, has a ball 65 projecting beneath the cross piece 62 near its forward end, as shown in FIG. 8. There depends from the rear part of the bottom of the body 46, at right angles thereto, a rectangular cross section stabilizing bar 64.

The upper tooling mount assembly 6 further comprises a pair of elongate pressure plate 66 having a chamfered, outer bottom edge 68. There upstands from the top edge of each plate 66, a rectangular locating projection 70, from which in turn upstands a pair of spaced stop lugs 72 from each of which projects outwardly in the plane of the plate 66, a stop flange 74. Each plate 66 has, located in respective holes in its top edge, a compression spring 76, one on each side of the projection 70 of the plate 66. The assembly 6 further comprises a pair of cover plates 78. As indicated in FIG. 7, the pressure plates 66 are assembled to the body 46 so that the projection 70 of each plate 66 is received between the block 54 and 56 on the respective side wall 50, the lugs 72 projecting above the blocks 54 and 56, and the springs 76 acting between the top edge of the plate 66 and the bottom faces of the blocks 54 and 56. The plates 66 are secured against the body 46, for limited vertical sliding movement relative thereto, by means of screws 80 passed through holes 79 in the cover plates 78 and threaded into the tapped holes 58 in the blocks 54 and 56.

The base assembly 8 comprises a flat elongate base plate 82 having a rectangular through opening 84 located towards the rear end of the plate 82, for slideably receiving the stabilizer bar 64 on the body 46. There is secured to one longitudinal lateral edge of the plate 82, the first anvil 10, the second anvil 12 being secured to the opposite longitudinal lateral edge of the plate 82. There projects upwardly from the plate 82, near its forward end, the ball 81 of a spring loaded ball plunger 83 in the plate 82, as shown in FIG. 8. The plate 82 has depending from its underside, centrally thereof, and spaced forwardly from the opening 84, a key 85 (FIGS. 7 and 8).

Figure 9:
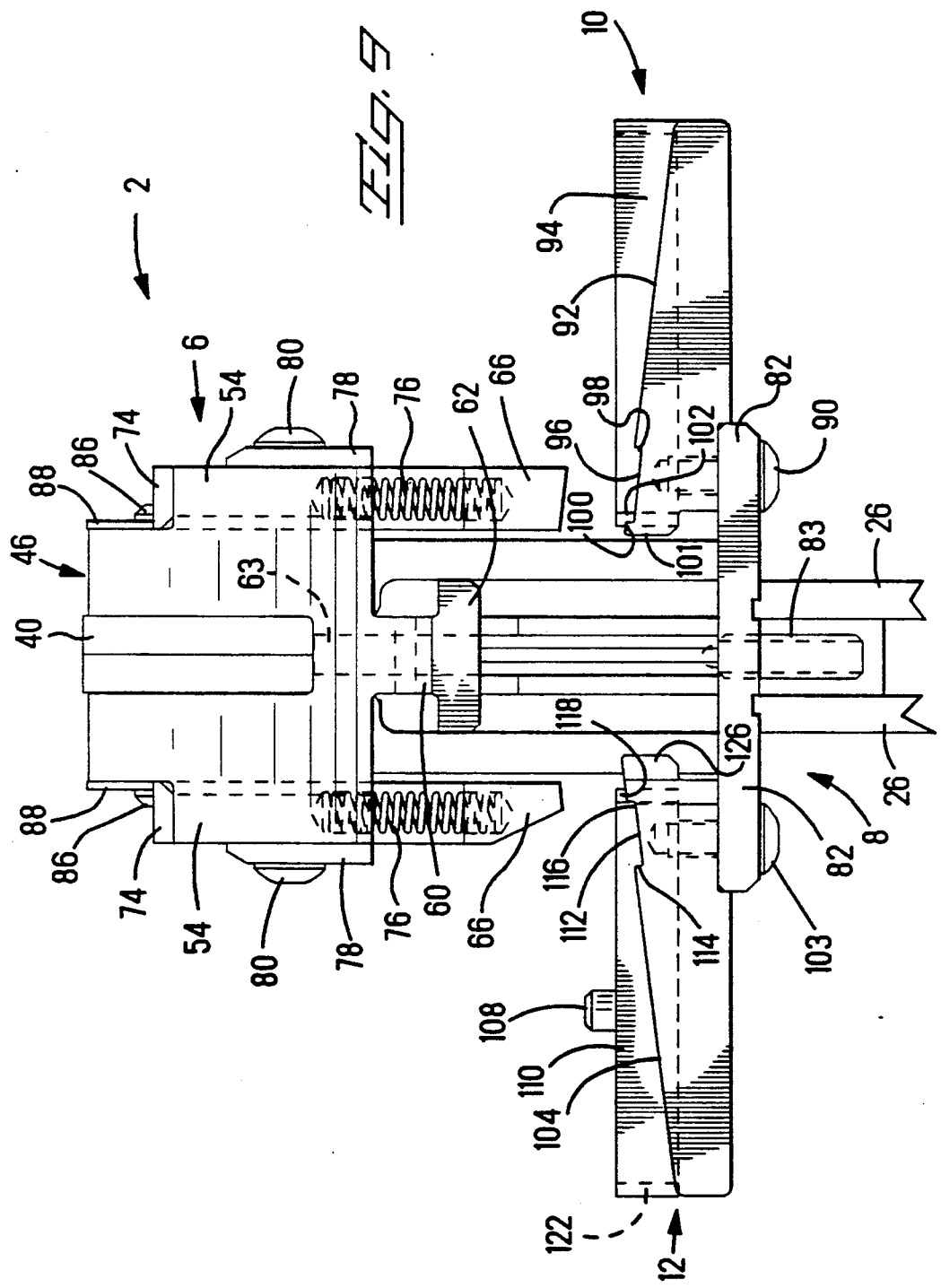
FIG. 9 is an enlarged front view of the tool.

The upper tooling assembly 6 is assembled to the base plate 82, by passing the bar 64 through the opening 84 in the plate 82. The actuating mechanism 4 is assembled to the assemblies 6 and 8, by passing the prongs 26, beneath the plate 82 so as to straddle the key 85 and that part of the bar 64 which projects below the plate 82 and by inserting the end portion 42 of the bell crank 40 into the channel 48 of the body 46, manipulating the assembly 4 to bring the holes 44 in the portion 42 into register with the holes 52 in the side walls 50 of the body 46, passing a grooved pin 86 through the holes 44 and 52, and securing the pin 86 in position by inserting spring clips 88 into the grooves of the pin 86. The springs 76 urge the pressure plates 66 towards the base plate 82 to an extent limited by the abutment of the stop flanges 74 against the tops of the blocks 54 and 56. The first anvil 10, which is fixed by means of screws 90 to the base 82, as shown in FIG. 9, has a longitudinally extending cable support surface 92 which slopes upwardly and inwardly of the tool 2. A fixed cable guide 94 upstands from one end of the surface 92 along its full width. The inner margin of the surface 92 is formed with a longitudinal recess 96 having an outer edge 98 and an inner edge provided by a vertical shoulder 100. The cable guide 94 has a cable stop 102 located just outwardly of the shoulder 100 as shown in FIG. 9. The anvil 10 has an inner longitudinal, forming flange 101 overhanging the base plate 82.

Figure 17:
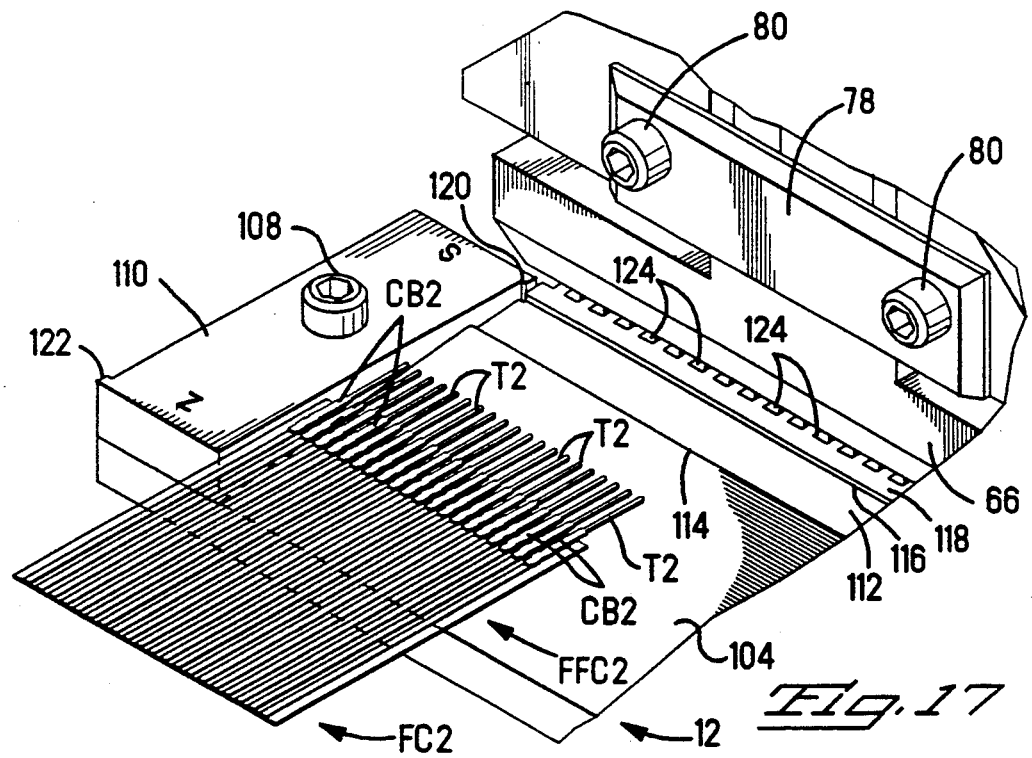
FIG. 17 is an enlarged, fragmentary, isometric front view of the tool with the die of FIG. 11 mounted thereto and showing the end portion of said second cable about to be presented to the tool.

The second anvil 12, which is secured to the base plate 82 by means of screws 103, has a longitudinally extending cable guide surface 104 which slopes upwardly and inwardly of the tool 2. There extends from one end of the anvil 12, a flange 106 (FIG. 7) to which can be secured, by means of a screw 108, in either of two opposite orientations, a reversible cable guide 110. The inner margin of the surface 104 is formed with a longitudinal recess 112 having an outer edge 114 and an inner edge 116 provided by a vertical shoulder 118. The shoulder 118 is of substantially greater width than the shoulder 100 of the anvil 10. As best seen in FIG. 17, the cable guide 110, which is of elongate rectangular shape, has, proximate to two diagonally opposed corners thereof, first and second cable stops 120 and 122, respectively, the stop 120 being somewhat wider than the stop 122. The end of the guide 110 at which the stop 120 is, is marked with the identification letter S, the other end of the guide 110 being marked with the identification letter Z. The inner vertical face of the anvil 12 is formed with a tab forming ribs 124, overhanging the base plate 82.

Figure 10:
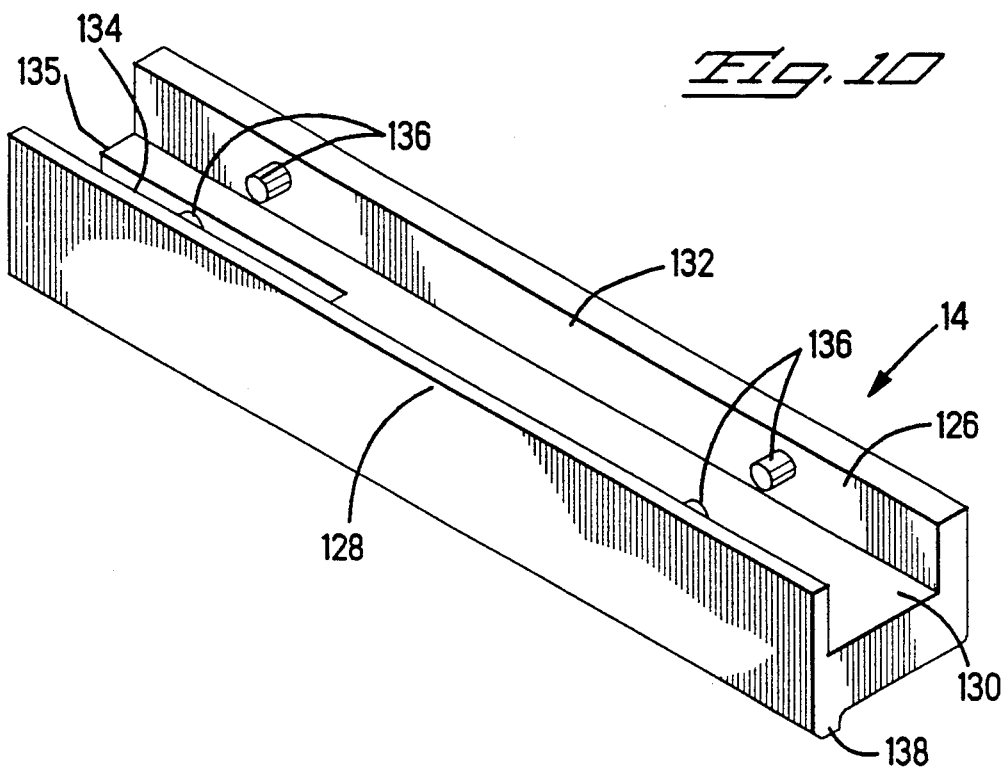
FIGS. 10 to 12 are enlarged isometric views of upper dies for the tool, for forming the tabs of the cables to the configurations of FIGS. 3 to 5 respectively.
Figure 11:
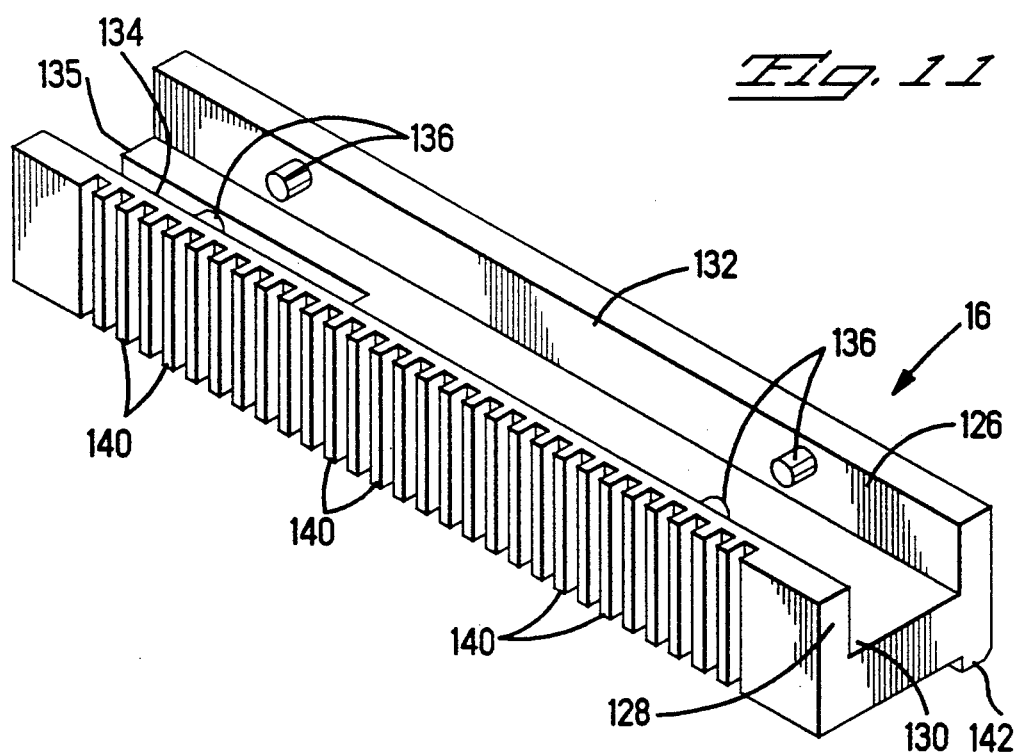
Figure 12:
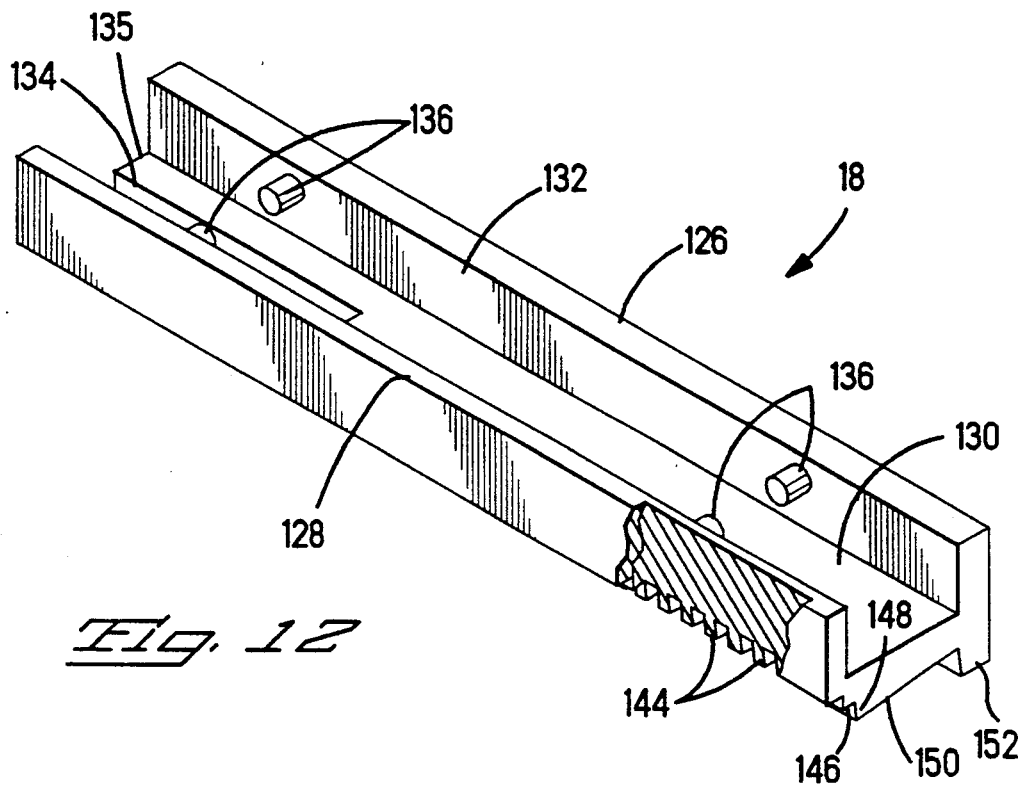
Figure 15:
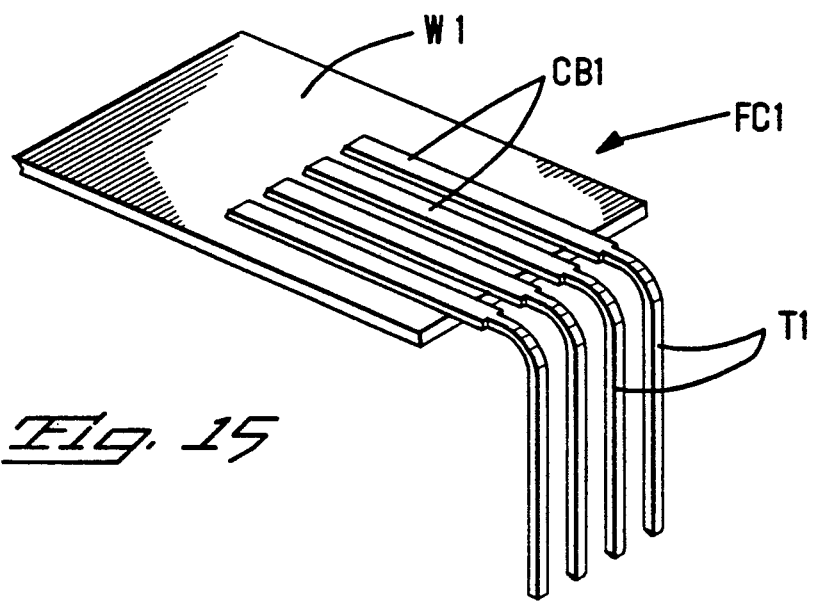
FIG. 15 is an enlarged, fragmentary, isometric view showing the tabs of said first cable formed to the configuration of FIG. 3 by means of the tool as shown in FIGS. 13 and 14.

Each of the first, second and third upper dies 14, 16 and 18, respectively, which are best seen in FIGS. 10 to 12, has parallel side walls 126 and 128 and a base 130, which co-operate to define an upwardly open channel 132 which is also open at both of its ends. One end portion of the base 130 is formed with a longitudinal, central, through slot 134 opening into the corresponding end 135 of the base 130. There project from the inner face of each side wall 126 and 128, two pins 136 each located towards a respective end of the channel 132. Each of the dies 14,16 and 18 can be secured to the upper tooling mount assembly 6, by sliding the die onto the spline 60 of the body 6, with the end 135 of the die leading, so that the pins 136 are supported on the upper faces of the cross piece 62, the stabilizing bar 64 being received in the slot 134 until the end of the slot 134 bottoms against the bar 64 and the ball 65 of the ball plunger 63 snaps into engagement with the base 130 of the die.

The die 14, which is best seen in FIG. 10 and which is for forming the tabs of the cable FC1 or FC2 to said first configuration has externally plain side walls 126 and 128, the side wall 128 being somewhat thinner than the side wall 126. An externally chamfered longitudinal guide rib 138 extends along the underside of the base 130 beneath the side wall 128.

The die 16, which is best seen in FIG. 11, and which is for forming the tabs of the cable C2 to said second, 90° staggered configuration, has side walls 126 and 128 which are of substantially equal thickness, the external surface of the side wall 128 being formed with parallel, spaced, tab forming vertical ribs 140 extending normally of the base 130. An externally chamfered guide rib 142 extends longitudinally of the under side of the base 130 beneath the side wall 126.

The die 18, which is best seen in FIG. 12, is for forming the tabs of the cable FC2 to said third, straight Z-configuration. The side wall 126 of the die 18 is somewhat thicker than the side wall 128 thereof, the side wall 128 being externally plain and the underside of the base 130 being formed with tab forming ribs 144, having stepped Z-configuration forming surfaces 146,148 and 150, which are appropriately angled with respect to each other. A guide rib 152 extends longitudinally of the underside of the base 130 beneath the side wall 126 of the die 18.

Figure 6:
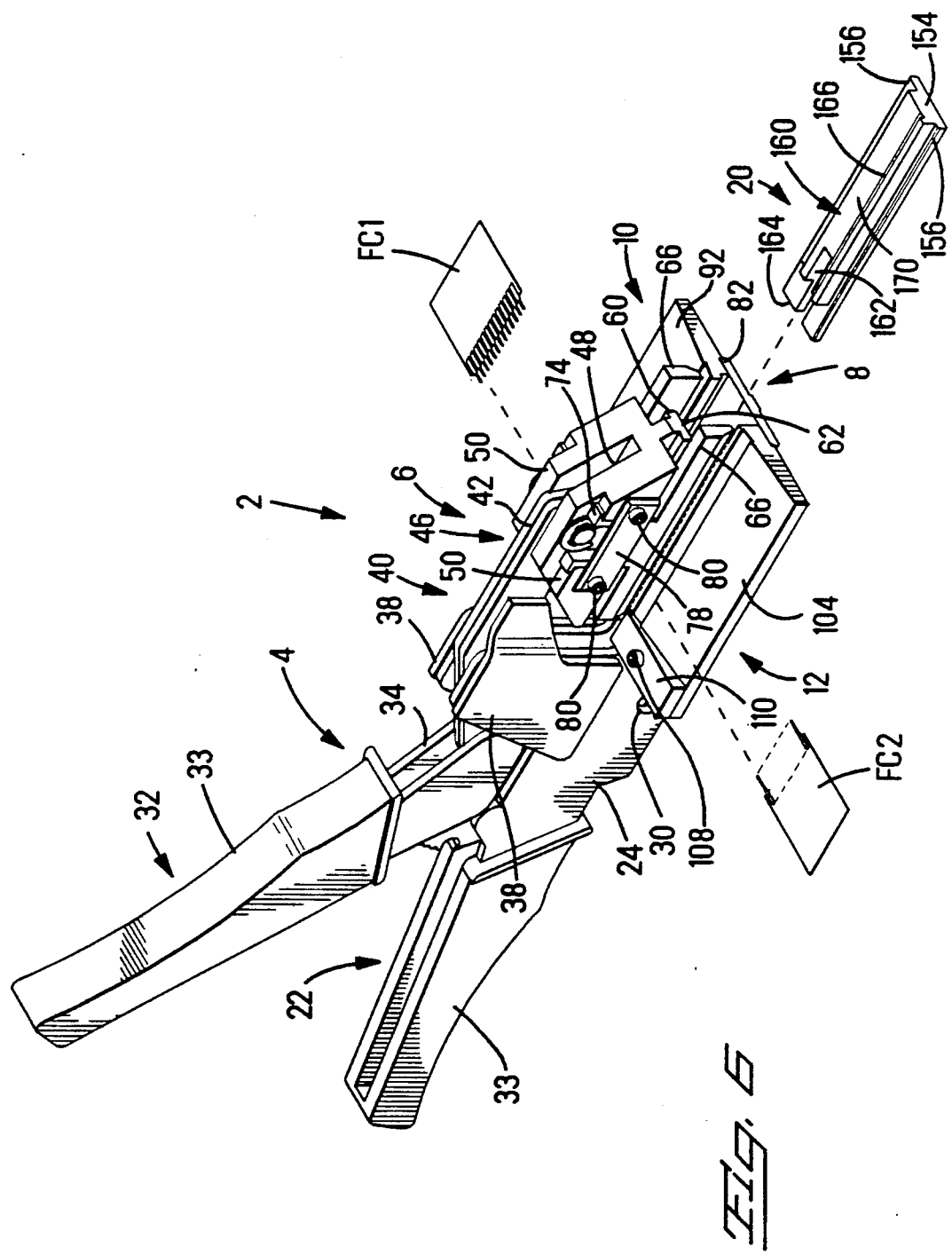
FIG. 6 is a partially exposed isometric view of a hand tool according to the invention, for use in bending said tabs, with parts of the tool omitted.
Figure 23:
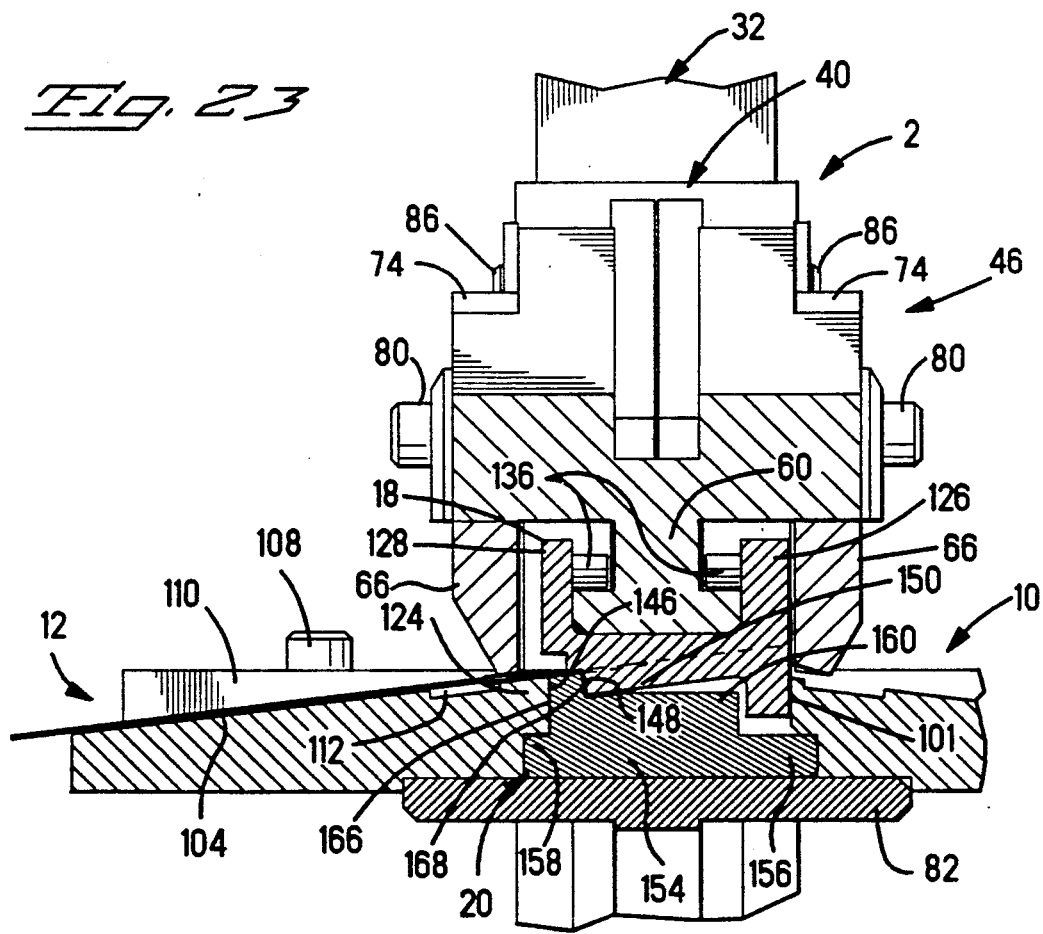
FIG. 23 is an enlarged cross sectional view of the tool showing the die of FIG. 12 mounted thereto and after having been driven down through a working stroke to form the tabs of said second cable to the configuration of FIG. 5, in cooperation with a lower insert of the tool.
Figure 24:
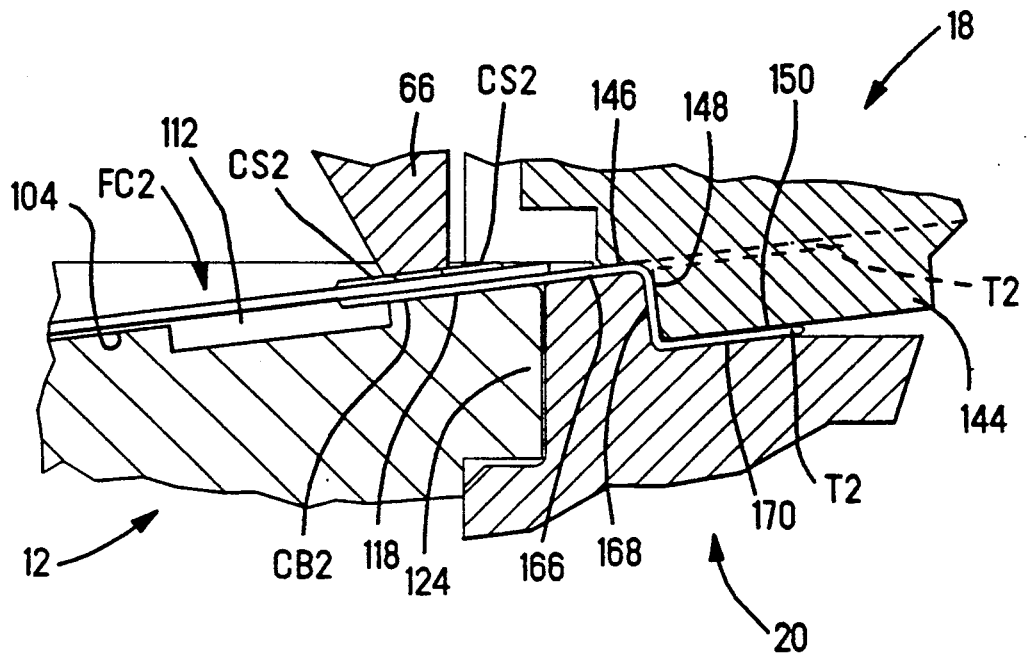
FIG. 24 is an enlarged, fragmentary isometric view illustrating details of FIG. 23.

The lower insert 20, which is for use with the die 18 and which is shown in FIGS. 6, 23 and 24, comprises an elongate base 154 having opposite longitudinal margins providing respective lateral flanges 156 and 158, the flange 156 being somewhat wider laterally, than the flange 158. The base 154 is surmounted by a forming die portion 160, a central slot 162 opening into the left hand, as best seen in FIG. 6, end of the insert 20 and extending into the die portion 160. The die portion 160 has, on its upper face, stepped Z-configuration forming surface 166,168 and 170, which are complimentary with the forming surfaces 146,148 and 150, respectively of the die 18.

The lower insert 20 is assembled to the tool 2 by sliding the insert 20, with its end 164 leading, as indicated in FIG. 6, along the base plate 82, from the front of the tool 2, so that the flange 156 of the insert 20 slideably engages between the plate 82 and the flange 101 of the anvil 10, the flange 158 of the insert 20 slideably engaging between the lower edges of the teeth 124 of the anvil 12 and the base plate 82. During the insertion of the insert 20, the stabilizing bar 64 is received in the slot 162 of the insert 20, the insertion thereof being limited by the abutment of the bar 64 against the end of the slot 162. The ball 81 of the spring loaded ball plunger 83 rides over the end of the slot 162 and engages the surface 170 so that the insert 20 is firmly but releasably retained in its inserted position.

In order to prepare the tool 2 for forming the tabs T1 of the cable FC1 or the tabs T2 of the cable FC2 to said 90° straight configuration, the die 14 is mounted to the upper tooling mount assembly 6 in the manner described above. The insert 20, is not, however, mounted to the tool 2, for this forming operation.

Figure 14:
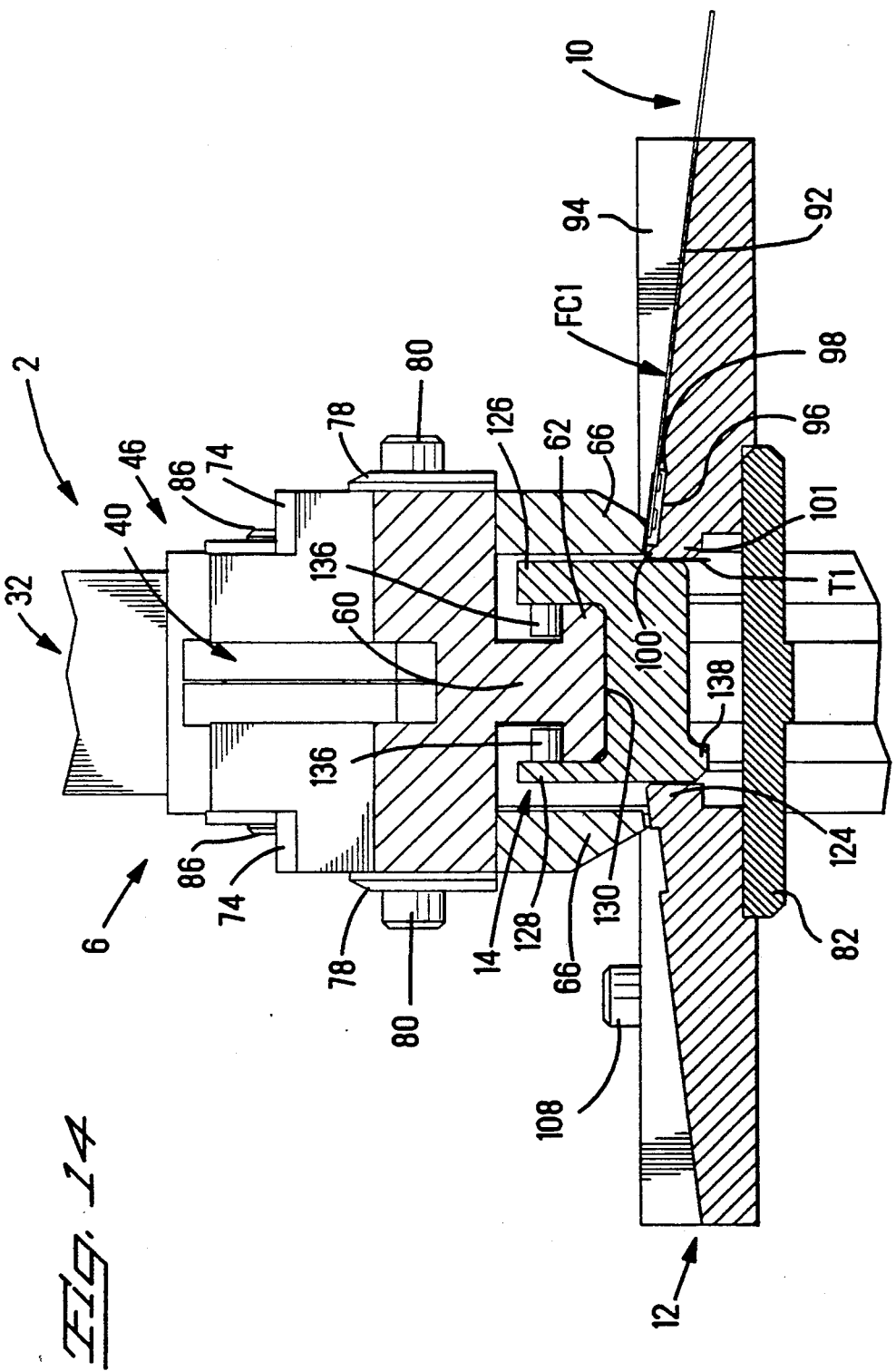
FIG. 14 is an enlarged cross sectional view of the tool with the die of FIG. 10 mounted thereto and with the tabs of said first cable inserted into the tool and formed thereby.
Figure 16:
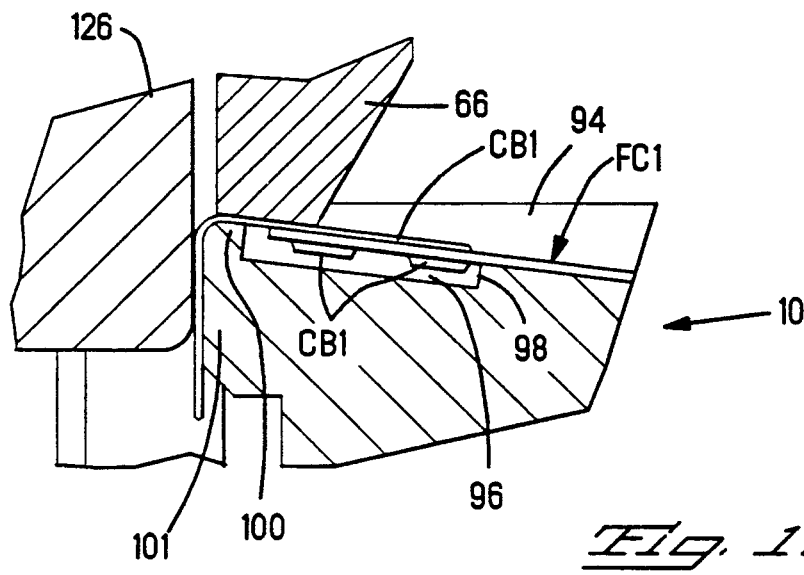
FIG. 16 is an enlarged, fragmentary, sectional view illustrating details of FIG. 14.

For forming the tabs T1 of the cable FC1, to the 90° straight configuration, the cable FC1 is slid onto the cable support surface 92 of the anvil 10 in the direction of the arrow A in FIG. 13, guided by the cable guide 94, with the crimped over sides CS of the crimping barrels CB1 facing downwardly, until the end of the cable FC1 abuts against the cable stop 102 on the cable guide 94, as indicated in broken lines in FIG. 13. The tabs T1 extend over the shoulder 100, beneath the pressure plate 66 adjacent to the anvil 10, and beneath the die 14 which is in a raised position prior to the handle 32 being pressed towards the handle 22. When the operator presses the handle 32 towards the handle 22 to a fully closed position, at the same time holding the cable FC1 down on the surface 92, the bell crank 40 forces down upper tooling mount assembly 6 and thus the die 14, through a working stroke. During the working stroke, the external surface of the side wall 126 of the die 14 co-operates with the inner edge of the shoulder 100, and the proximate surface of the flange 110 of the anvil 10, to bend down all of the tabs T1 at right angles to the cable FC1 as shown in FIGS. 3, 14 and 16, the part of each tab T1 near to the crimping barrel CB1, associated therewith, being firmly gripped between the shoulder 100 and the pressure plate 66 thereabove, under the action of the springs 76, as will best be apparent from FIG. 16. Also, as best seen in FIG. 16, the crimped over sides CS1 of the crimping barrels CB1 are received in the recess 96. As will best be apparent from FIG. 14, the chamfered guide rib 138 of the die 14 serves to guide the side wall 128 thereof into sliding engagement with the teeth 124 of the anvil 12. The operator now releases the handle 32 so that the die 14 is returned to its initial raised position and the operator then removes the cable FC1 from the tool 2 by sliding the cable out from the front of the tool.

For forming the tabs T2 of the cable FC2 to the 90° straight configuration, the cable FC2 is slid on to the surface 92 approximately centrally thereof, with the crimped over sides CS2 of the crimping barrels CB2 facing downwards, so that the tabs T2 are inserted under the adjacent pressure plate 66 until the crimping barrels CB2 pass the recesses 96. The operator then slides the cable FC2 back until the crimped over side CS2 of the crimping barrels CB2 engage against the outer edge 98 of the recess 96 whereby the cable is oriented perpendicularly with respect to the shoulder 100. The operator then cycles the tool 2 in the manner described above, to form the tabs T2, and remove the cable FC2 from the tool 2, also in the manner described above.

In order to prepare the tool 2 for forming the tabs T2 of the cable FC2 to said staggered 90° configuration, the die 16 is mounted to the assembly 6 in the manner described above, insert 20 is not, however, mounted to the tool 2 for this forming operation. The reversible cable guide 110 of the anvil 12 is oriented, as shown in FIG. 17, with the indicator letter S thereon nearest to the body 46 and the cable stop 120 proximate to the shoulder 118, if necessary by removing the screw 108 and re-orienting the cable guide 110 on the anvil 12.

Figure 18:
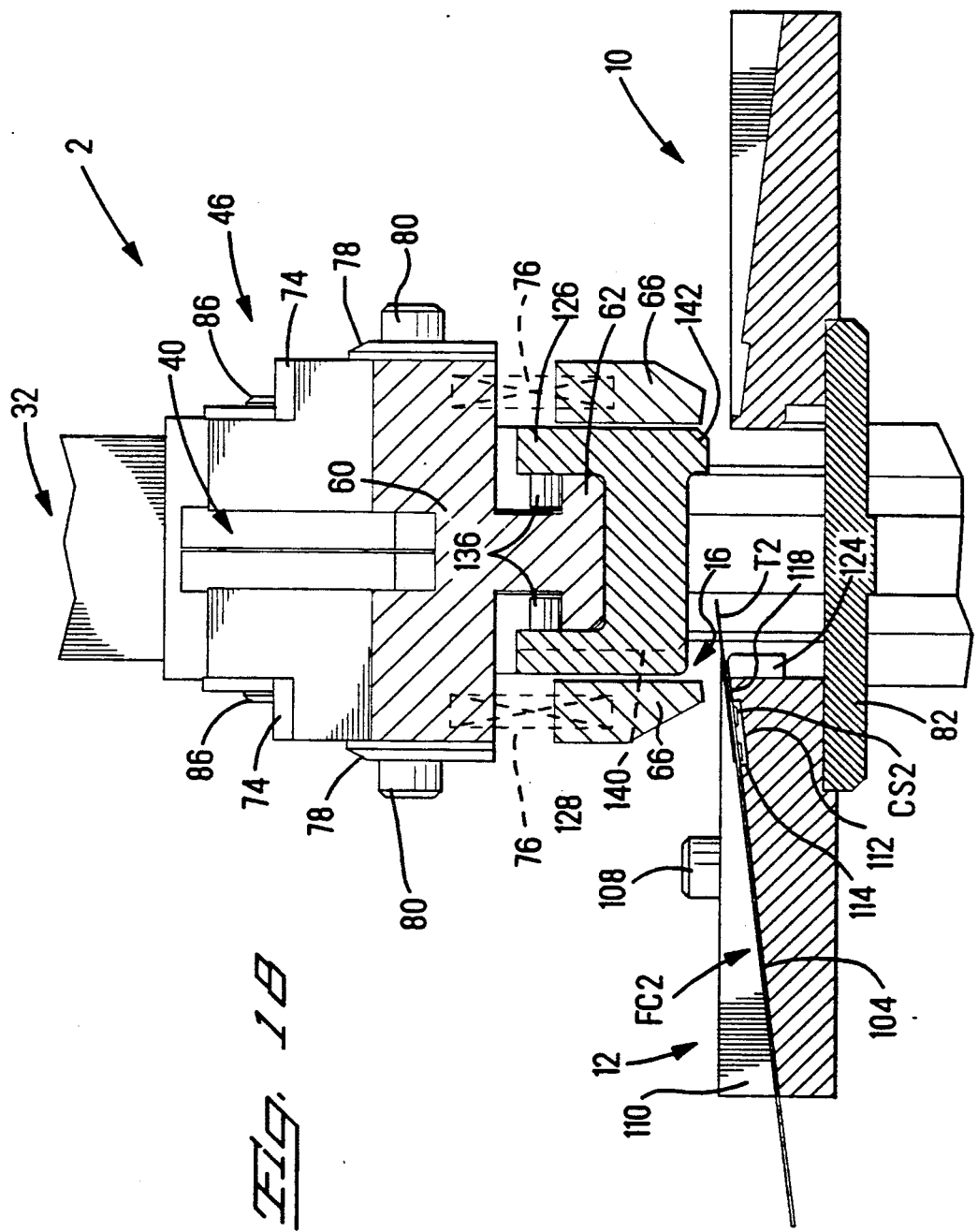
FIG. 18 is an enlarged cross sectional view of the tool with the die of FIG. 11 mounted thereto and showing the tabs of the end portion of the second cable inserted into the tool, the die being in a raised position.
Figure 19:
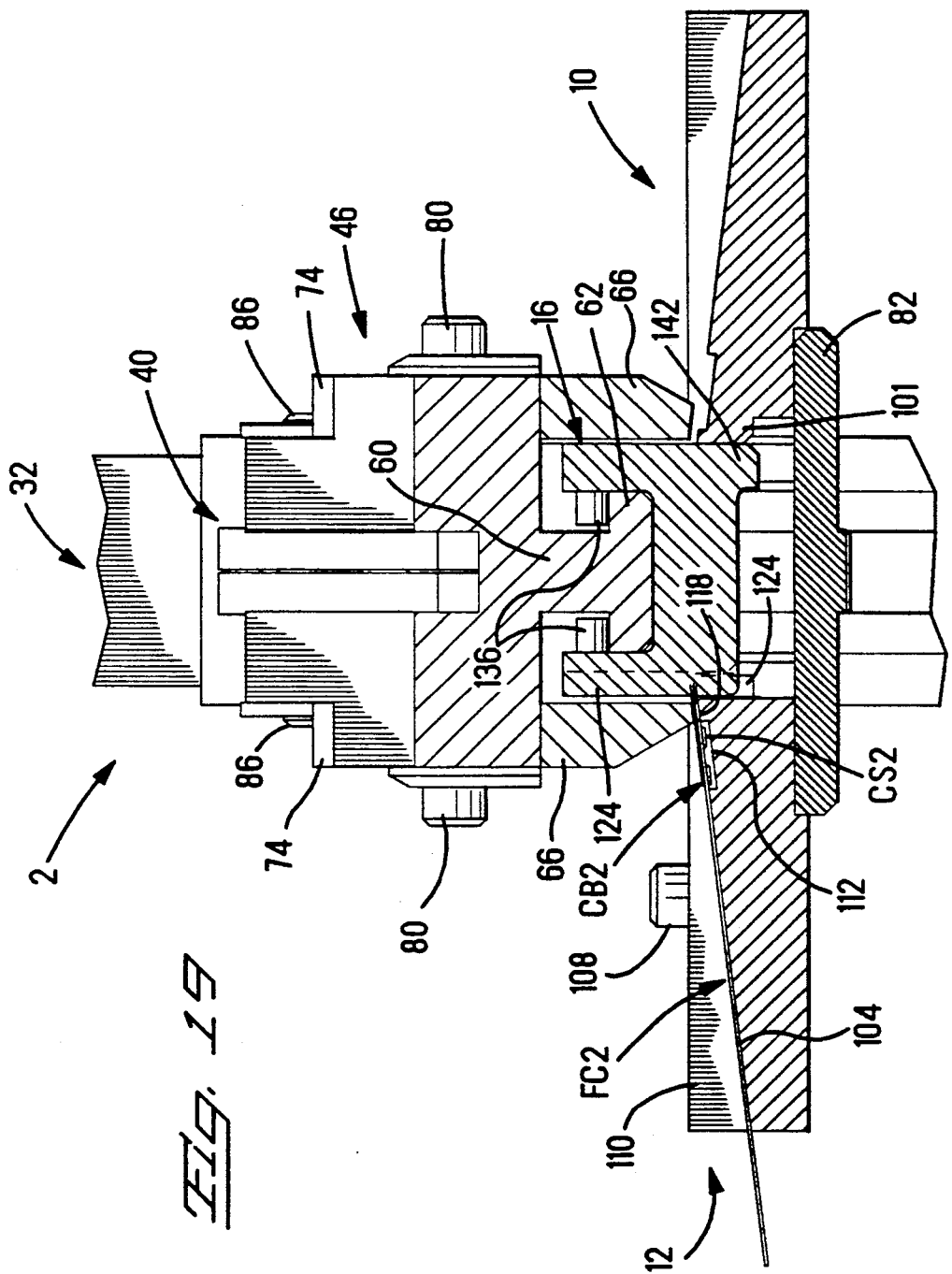
FIG. 19 is a similar view to that of FIG. 18 but showing the die after having been driven down through a working stroke.
Figure 20:
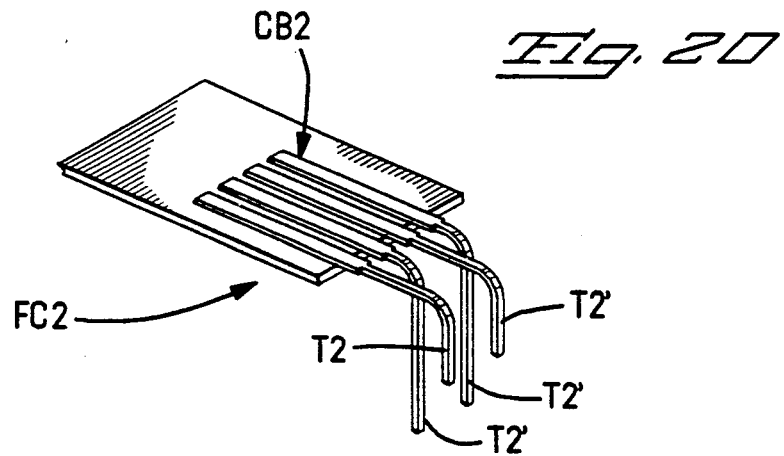
FIG. 20 is an enlarged, fragmentary isometric view showing the tabs of the second cable when formed by means of the tool as shown in FIG. 19.
Figure 21:
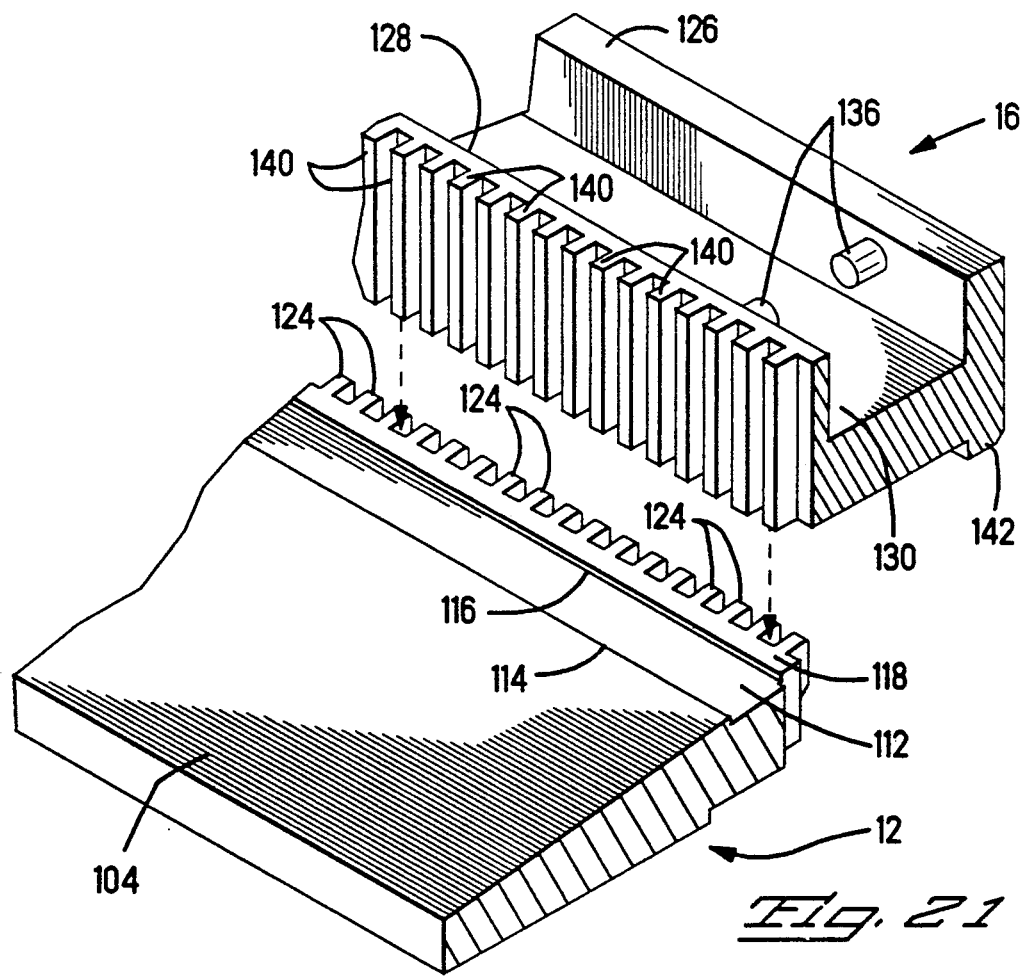
FIG. 21 is an enlarged, fragmentary isometric view illustrating the operation of the die of FIG. 11 in cooperation with an anvil of the tool.
Figure 22:
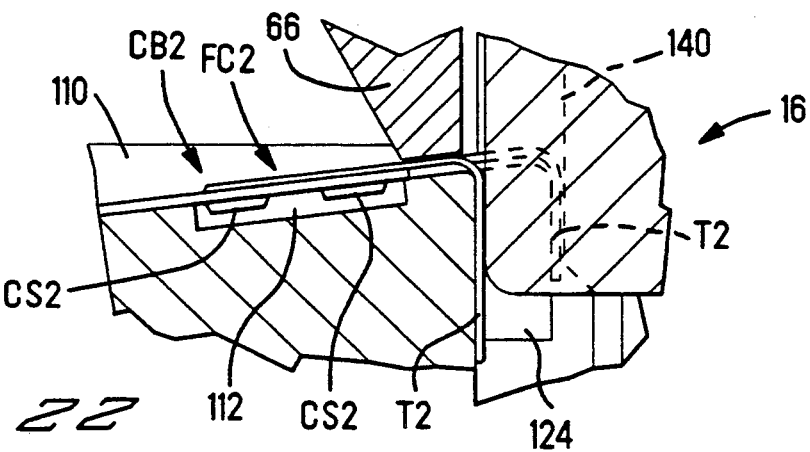
FIG. 22 is an enlarged, fragmentary, sectional view illustrating details of FIG. 19.

The operator slides the cable FC2 on to the cable supporting surface 104 of the anvil 12, as shown in FIG. 17, with the crimped oversides CS2 of the crimping barrels CB2 facing downwards, and with the left hand, as seen in FIG. 17, edge of the cable 22 guided by the cable guide 110 until the end of the cable FC2 abuts against the cable stop 120. In this position of the cable FC2, the tabs T2 project over the shoulder 18, beneath the adjacent pressure plate 66, and beneath the die 16, which is in its raised position as shown in FIG. 18, the crimped over sides CS2 being received in the recess 112. The operator then depresses the handle 32 towards the handle 22 thereby driving the die 16 down through a working stroke, FIG. 19, whereby the ribs 140 of the die 16 enter between the ribs 124 of the anvil 12, as indicated in FIG. 21, to bend alternate ones of the tabs T2 across the shoulder 118 so as to lie between the ribs 124, and the remaining tabs T2 over the ends of the ribs 124 to lie between the ribs 140, as best seen in FIG. 22. Be it noted that the ribs 124 and 140 are of equal dimensions and are equally spaced but are offset from one another when the die 16 is mounted to the tool 2. The tabs T2 are accordingly bent by means of the anvil 12 and the die 16 to provide two rows of tab end portions, as shown in FIGS. 4 and 20, for inserting in corresponding rows of holes in a printed circuit board. As will best be apparent from FIG. 19, the chamfered guide rib 142 of the die 16 serves to guide the die 16 into sliding relationship with the flange 110 of the anvil 10. The tabs T2 having been formed as described above, the operator releases the handle 32 so that the die 16 is moved through a return stroke. The operator then adjusts the cable FC2 to disengage the rearward tabs T2 from the ribs of the anvil 12 and then slides the cable out from the front of the tool 2.

In order to prepare the tool 2 for forming the tabs T2 of the cable FC2 to said straight Z-configuration, the die 18 is mounted to the upper tooling mount assembly 6 in the manner described above and the insert 20 is assembled to the tool 2 in the manner described above. Cable guide 110 of the anvil 12 is oriented with the identification letter Z positioned nearest to the assembly 6 and with the cable stop 122 proximate to the shoulder 118.

Figure 25:
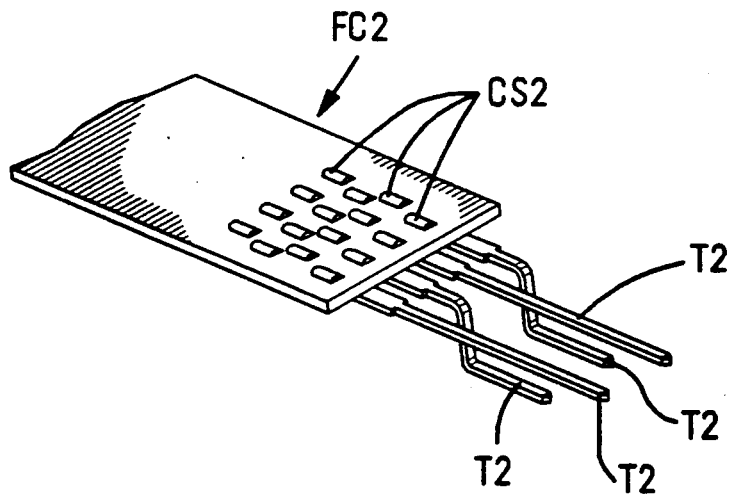
FIG. 25 is an enlarged, fragmentary isometric view showing the tabs of the second cable formed to the configuration of FIG. 5.

The operator slides the cable FC2 on to the surface 104 of the anvil 12, with the crimped over sides CS2 of the crimping barrels CB2 uppermost, until the cable FC2 abuts against the cable stop 122, the die 18 being in its raised position. In this position of the cable FC2, alternate ones of the tabs T2 extend across the tops of the respective ribs 124 of the anvil 12, the remaining tabs T2 extending between the tops of the respective ribs 124. Said alternate tabs T2 also extend in alignment with respective ribs 144 of the die 18, said remaining tabs T2 being aligned with respective spaces between the ribs 144. The operator now depresses the handle 32 to drive the die 18 through a working stroke, so that as shown in FIGS. 23 and 24, alternate tabs T2 are formed to Z-shape (as will also be appreciated from FIGS. 5 and 25), between the forming surfaces 146,148 and 150 of the ribs 144 and the respective forming surfaces 166,168 and 170 of the insert 20, whilst the remaining tabs T2 project between the ribs 144 and so remain undeformed and therefore straight. The crimping barrels CB2 are held down resiliently as the die 18 descends, by the adjacent pressure plate 66. The rib 152 of the die 18 serves to guide it, by sliding engagement with the flange 101 of the anvil 10. On completion of the forming operation, the operator releases the handle 32 and slides the cable FC2 out of the tool 2 from the front thereof.

A further die (not shown) similar to the die 18 but having continuous, rather than divided forming surfaces, may be provided for forming all of the tabs T2 to Z-configuration instead of only alternate ones of the tabs T2.

The tool T2 may be mounted for use, on a bench stand (not shown) associated with a clamp (not shown), of said tool mounting assembly disclosed in the patent application cited above. To this end, the bench stand is positioned on a margin of a work bench top and the tool 2 is located on the bench stand with the cheeks 24 of the tool 2 received in a longitudinal channel in the top of the bench stand. The clamping pin of the clamp is then inserted through the holes 30 in the cheeks 24. A clamping screw of the clamp is then tightened against the under side of the work bench top. A tool 2 is thereby held steady for the proper positioning of the anvil 10 or the anvil 12 is to be used.

We claim:

1. A kit of parts for a hand tool for forming electrical contact elements projecting from cable end portions, to a plurality of different configurations, the kit of parts comprising;
    a first die having first forming surface means for use in forming the contact elements of a first of said cable end portions to at least one first configuration;
    a second die having second forming surface means for use in forming the contact elements of a second of said cable end portions to at least one second configuration which is different from said first configuration;
    a base assembly having a first forming anvil associated with said first die and having forming surface means for cooperation with said first forming surface means to form the contact elements of the first cable end portion to said at least one first configuration, and a second forming anvil associated with said second die and having forming surface means for cooperation with said second forming surface means to form the contact elements of said second cable end portion to said at least one second configuration, said forming surface means of said anvils facing towards each other to define an opening for receiving a selected die between the forming surface means of said anvils, each anvil having a cable receiving surface bounded by a contact element bending shoulder, said cable receiving surfaces projecting in opposite directions from the respective contact element bending shoulders and away from said opening;
    an upper tooling mount assembly for releasably supporting the selected one of said first and second dies and being connectable to said base assembly for movement through a working stroke theretowards and into said opening to cause the forming surface means of said selected die to perform said cooperation thereof with the forming surface means of the anvil associated with said selected die, and for movement through a return stroke away from said base assembly and out of said opening; and
    a hand operated actuating mechanism connected to said assemblies for moving said tooling mount assembly through said working and return strokes thereof.

2. A kit of parts as claimed in claim 1, wherein the upper tooling mount assembly has resiliently mounted on each of two opposite sides thereof a pressure plate for holding the contact elements of a respective cable end portion down on a respective one of said cable receiving surfaces during the working stroke of the upper tooling assembly.

3. A kit of parts as claimed in claim 1, wherein a cable guide at one side of each cable receiving surface extend at right angles to the contact element bending shoulder thereof and is provided with a cable stop adjacent to that bending shoulder.

4. A kit of parts as claimed in claim 1, wherein an elongate cable guide at one side of one cable receiving surface extends at right angles to the bending shoulder thereof, a first cable stop being provided at one end of said cable guide proximate to said bending shoulder and a second cable stop being provided at the opposite end of said cable guide, the cable guide being reversible to bring the second cable stop into proximity with the bending shoulder.

5. A kit of parts as claimed in claim 1, wherein a stabilizing bar depends from the upper tooling mount assembly, the base assembly having a base plate supporting said anvils in spaced relationship thereon, the base plate defining an opening between said anvils, for receiving the stabilizing bar, means depending from the upper tooling mount assembly for slideably receiving said selected die to an extend limited by the abutment thereof against the stabilizing bar.

6. A kit of parts as claimed in claim 1, wherein the base assembly comprises a baseplate supporting said anvils, the actuating mechanism comprising a moveable actuating member for connection to said tooling mount assembly and a fixed projection below said actuating member for engaging beneath the baseplate of the base assembly, the actuating mechanism further comprising a handle for moving said actuating member to drive said upper tooling assembly through its working and its return strokes.

7. A kit of parts as claimed in claim 6, wherein the actuating member is pivotally mounted to the actuating mechanism, the upper tooling assembly defining a channel for receiving an end of the actuating member and means being provided for pivotally connecting said end of the actuating member to side walls of said channel, said handle being depressible drive said actuating member towards said fixed projection.

8. A kit of parts as claimed in claim 1, wherein a spline depends from a lower face of said tooling mount assembly and terminates in a cross piece spaced from said lower face and having die supporting surfaces facing said lower face, each of said dies defining a channel for slideably receiving said cross piece and having means projecting from internal surfaces of opposite side walls of the channel for lodging against said supporting surfaces of the cross piece, when the cross piece is received in the channel, detent means being provided on the cross piece for resiliently engaging the base of the channel.

9. A kit of parts as claimed in claim 1, further comprising a lower, contact element forming insert for insertion between said anvils and a third contact element forming die for releasable support by said upper tooling assembly and for co-operation with said insert to form the contact elements of a third of said cable ends to a third configuration.

10. A kit of parts for assembly to provide a hand tool for forming electrical tabs projecting rectilinearly from end portions of flat flexible cables and being electrically connected to conductors of the cables, the kit of parts comprising;
- a first elongate die for use in forming the tabs of a first of said cable end portions to at least one first configuration;
- a second elongate die for use in forming the tabs of a second of said cable end portions to at least one second configuration;
- a base assembly having a baseplate, a first elongate anvil on the baseplate for cooperation with said first die to form the tabs of said first cable end portion to said at least one first configuration, a second elongate anvil on the baseplate and arranged in spaced parallel relationship with said first anvil, for cooperation with said second forming die to form the tabs of a second of the cable ends to said at least one second configuration;
- an upper tooling mount assembly for receiving a selected one of said first and second dies said tooling mount assembly being connected to said baseplate between said anvils, for movement through a working stroke to move said selected die between said anvils in tab forming relationship with the anvil for cooperation with that die, and through a return stroke to withdraw said selected die from between said anvils; and
- an actuating mechanism connected to said tooling mount assembly and to said base assembly and having means manually actuable for driving said tooling mount assembly through its working and its return strokes, wherein the upper tooling mount assembly comprises a body defining an upwardly open channel, and a stabilizing bar depending from the body and extending slidably through a hole in said baseplate, the actuating mechanism comprising an actuating arm having a free end portion pivotally mounted in said channel, an actuating handle, a lever operatively connecting the actuating handle to said actuating arm, and a fixed arm engaging the under side of the baseplate.

11. A kit of parts as claimed in claim 10, wherein said first die has a flat forming surface for co-operation with complimentary surfaces of said first anvil to bend each tab of said first cable end portion through a right angle, said second die having a ribbed forming surface for co-operation with a complimentarily ribbed forming surface of said second anvil for bending each alternate tab of said second cable end portion through a right angle at a first position along the tab and for bending each remaining tab of said second cable end portion through a right angle at a second position along said remaining tab.

12. A kit of parts as claimed in claim 11, further comprising an elongate insert for insertion between said anvils and having a stepped forming surface, and a third elongate forming die for reception by the upper tooling mount assembly and having stepped forming surfaces for co-operation with those of said insert for forming tabs of a third one of said cable ends portions to Z-configuration.

13. A kit of parts as claimed in claim 10, comprising a spring loaded pressure plate slidably mounted to said body on each side of said channel, for holding each cable end portion on a respective one of said anvils during the working stroke of said tooling mount assembly.

14. A kits of parts as claimed in claim 12, wherein each of said forming dies and said insert defines a longitudinal slot for receiving a stabilizing post on said tooling mount assembly said tooling mount assembly having a spring loaded detent for engaging said dies, and said baseplate having a spring loaded detent for engaging said insert.

15. A hand tool for forming electrical tabs projecting rectilinearly from end portions of flat flexible cables, the hand tool comprising;
- a base assembly having a base plate and first and second tab forming elongate anvils mounted in spaced relationship on the base plate;
- an upper tooling mount assembly exchangeably supporting a tab forming elongate die and being mounted to said baseplate for movement theretowards, slidably to insert said die between said anvils, and away from the baseplate to withdraw said die from between said anvils; and
- a hand operated actuating mechanism connected to said assemblies of removing said tooling mount assembly towards and away from said baseplate, wherein said anvils project from opposite sides of the baseplate, each anvil having a flat cable receiving surface having a tab bending elongate shoulder for slidable engagement by said die and wherein each anvil has an elongate cable guide extending at right angles to said shoulder and having a laterally projecting cable stop adjacent thereto.

16. A kit of parts for a hand tool for forming electrical contact elements projecting from cable end portions to a plurality of configurations, the kit of parts comprising;
- a first die for use in forming the contact elements of a first of said cable end portions to at least one first configuration;
- a second die for use in forming the contact elements of a second of said cable end portions to at least one second configuration;
- a base assembly having a first forming anvil associated with said first die for cooperation therewith to form the contact elements of the first cable end portion to said at least one first configuration, and a second forming anvil associated with said second die for cooperation therewith to form the contact elements of said second cable end portion to said at least one second configuration; 'an upper tooling mount assembly for releasably supporting a selected one of said first and second dies and being connectable to said base assembly for movement through a working stroke theretowards to cause said selected die to perform said cooperation thereof with the anvil associated therewith, and for movement through a return stroke away from said base assembly; and a hand operated actuating mechanism connected to said assemblies for moving said tooling mount assembly through said working and return strokes thereof; wherein a stabilizing bar depends from the upper tooling mount assembly, the base assembly having a base plate supporting said anvils in spaced relationship thereon, the base plate defining an opening between said anvils, for receiving the stabilizing bar, means depending from the upper tooling mount assembly for slidably receiving said selected die to an extend limited by the abutment thereof against the stabilizing bar.

17. A kit of parts for a hand tool for forming electrical contact elements projecting from cable end portions, to a plurality of configurations, the kit of parts comprising;

a first die for use in forming the contact elements of a first of said cable end portions to at least one first configuration;

a second die for use in forming the contact elements of a second of said cable end portions to at least one second configuration;

a base assembly having a first forming anvil associated with said first die for cooperation therewith to form the contact elements of the first cable end portion to said at least one first configuration, and a second forming anvil associated with said second die for cooperation therewith to form the contact elements of said second cable end portion to said at least one second configuration;

an upper tooling mount assembly for releasably supporting a selected one of said first and second dies and being connectable to said base assembly for movement through a working stroke theretowards to cause said selected die to perform said cooperation thereof with the anvil associated therewith, and for movement through a return stroke away from said base assembly; and a hand operated actuating mechanism connected to said assemblies for moving said tooling mount assembly through said working and return strokes thereof, wherein a spline depends from a lower face of said tooling mount assembly and terminates in a cross piece spaced from said lower face and having die supporting surfaces facing said lower face, each of said dies defining a channel for slideably receiving said cross piece and having means projecting from internal surfaces of opposite side walls of the channel for lodging against said supporting surfaces of the cross piece, when the cross piece is received in the channel, detente means being provided on the cross piece for resiliently engaging the base of the channel.

18. A hand tool for forming electrical tabs projecting rectilinearly from end portions of flat flexible cables, the hand tool comprising;

a base assembly having a base plate and first and second tab forming elongate anvils mounted in spaced relationship on the base plate;

an upper tooling mount assembly exchangeably supporting a tab forming elongate die and being mounted to said baseplate for movement theretowards, slidably to insert said die between said anvils, and away from the a baseplate to withdraw said die from between said anvils; and a hand operated actuating mechanism connected to said assemblies of removing said tooling mount assembly towards and away from said baseplate, wherein the upper tooling mount assembly comprises a body defining an upwardly open channel, and a stabilizing bar depending from the body and extending slidably through a hole in said baseplate, the actuating mechanism comprising an actuating arm having a free end portion pivotally mounted in said channel, an actuating handle, a lever operatively connecting the actuating handle to said actuating arm, and a fixed arm engaging the under side of the baseplate.

* * * * *